(12) United States Patent
Fang et al.

(10) Patent No.: US 8,373,179 B2
(45) Date of Patent: Feb. 12, 2013

(54) LIGHT EMITTING DIODE

(75) Inventors: Kuo-Lung Fang, Hsinchu County (TW); Chien-Sen Weng, Hsinchu County (TW); Chih-Wei Chao, Taipei (TW)

(73) Assignee: Lextar Electronics Corp., Hsinchu (TW)

(*) Notice: Subject to any disclaimer, the term of this patent is extended or adjusted under 35 U.S.C. 154(b) by 17 days.

(21) Appl. No.: 13/159,430

(22) Filed: Jun. 14, 2011

(65) Prior Publication Data

US 2011/0241064 A1 Oct. 6, 2011

Related U.S. Application Data

(63) Continuation of application No. 12/397,353, filed on Mar. 4, 2009, now Pat. No. 7,989,819.

(30) Foreign Application Priority Data

Dec. 15, 2008 (TW) .............................. 97148836 A

(51) Int. Cl.
*H01L 33/00* (2010.01)
(52) U.S. Cl. .................................. 257/79; 257/E33.065
(58) Field of Classification Search .................. None
See application file for complete search history.

(56) References Cited

U.S. PATENT DOCUMENTS

| | | | |
|---|---|---|---|
| 6,298,079 B1* | 10/2001 | Tanaka et al. | 372/46.01 |
| 2001/0011730 A1* | 8/2001 | Saeki | 257/79 |
| 2004/0016934 A1* | 1/2004 | Murakami et al. | 257/97 |
| 2006/0244005 A1* | 11/2006 | Chen | 257/122 |
| 2007/0145381 A1* | 6/2007 | Unno et al. | 257/79 |

* cited by examiner

*Primary Examiner* — Benjamin Sandvik
(74) *Attorney, Agent, or Firm* — McClure, Qualey & Rodack, LLP

(57) ABSTRACT

A LED chip including a substrate, a semiconductor device layer, a current blocking layer, a current spread layer, a first electrode and a second electrode is provided. The semiconductor device layer is disposed on the substrate. The current blocking layer is disposed on a part of the semiconductor device layer and includes a current blocking segment and a current distribution adjusting segment. The current spread layer is disposed on a part of the semiconductor device layer and covers the current blocking layer. The first electrode is disposed on the current spread layer, wherein a part of the current blocking segment is overlapped with the first electrode. Contours of the current blocking segment and the first electrode are similar figures. Contour of the first electrode and is within contour of the current blocking segment. The current distribution adjusting segment is not overlapped with the first electrode.

18 Claims, 4 Drawing Sheets

LIGHT EMITTING DIODE

CROSS-REFERENCE TO RELATED APPLICATION

This is a continuation application of patent application Ser. No. 12/397,353, filed on Mar. 4, 2009, now allowed, which claims the priority benefit of Taiwan patent application serial No. 97148836, filed on Dec. 15, 2008. The entirety of each of the above-mentioned patent applications is hereby incorporated by reference herein and made a part of this specification.

BACKGROUND OF THE INVENTION

1. Field of the Invention

The present invention relates to a light-emitting diode (LED) chip. More particularly, the present invention relates to a LED chip where a current distribution therein can be adjusted.

2. Description of Related Art

With development of semiconductor technology, a present LED may achieve a high-brightness output, and since the LED has advantages of power-saving, small-size, low power driving and non-mercury, etc., it has been widely used in displays and illumination devices, etc. Generally, a light-emitting efficiency of a LED chip relates to internal quantum efficiency (i.e. light-extraction efficiency) of the LED chip. When the light emitted from a light-emitting layer has a higher transmittance with respect to the LED chip, it represents that the LED chip has good light-emitting efficiency.

Electrodes of the LED chip are generally fabricated by metal materials, and since the metal materials are opaque, the light emitted from a region under the electrode of the LED chip may be blocked, which may cause a waste of power. Therefore, a technique of forming a current blocking layer between the electrode and the semiconductor device layer is developed.

FIG. 1A is top view of a conventional LED chip having a current blocking layer. FIG. 1B is a cross-sectional view of the LED chip of FIG. 1A along the I-I' line. Referring to FIG. 1A and FIG. 1B, the LED chip 100 includes a substrate 110, a semiconductor device layer 120, a current blocking layer 130, a current spread layer 140, a first electrode 150 and a second electrode 152. The semiconductor device layer 120 includes a first type semiconductor layer 122, a light-emitting layer 124 and a second type semiconductor layer 126.

As shown in FIG. 1A and FIG. 1B, the second electrode 152 is disposed on the first type semiconductor layer 122. The first electrode 150 is disposed on the second type semiconductor layer 126, and the current blocking layer 130 is disposed between the first electrode 150 and the second type semiconductor layer 126. Moreover, the current spread layer 140 is disposed between the first electrode 150 and the second type semiconductor layer 126, and covers the current blocking layer 130 entirely, wherein a shape of the current blocking layer 130 and a shape of the first electrode 150 are similar figures, and an area of the current blocking layer 130 is slightly greater than that of the first electrode 150. The current blocking layer 130 is used to block the current passing through an area covered by the current blocking layer 130. If the LED chip 100 does not have the current blocking layer 130, the light emitted from the light-emitting layer 124 under the first electrode 150 can be shielded by the first electrode 150, which may lead to a poor light-emitting efficiency of the whole LED chip 100. If the LED chip 100 has the current blocking layer 130, the light-emitting layer 124 located at a region under the current blocking layer 130 does not emit light or only emits few light, while the light-emitting layer 124 located at a region other than that under the current blocking layer 130 can emit light without being shielded by the first electrode 150. Therefore, waste of the power at the region under the first electrode 150 can be reduced by applying the current blocking layer 130.

SUMMARY OF THE INVENTION

The present invention is directed to a LED chip having a current blocking layer for adjusting a current distribution in the LED chip.

The present invention provides a LED chip including a substrate, a semiconductor device layer, a current blocking layer, a current spread layer, a first electrode and a second electrode. The semiconductor device layer is disposed on the substrate. The current blocking layer is disposed on a part of the semiconductor device layer, wherein the current blocking layer includes a current blocking segment and a current distribution adjusting segment. The current spread layer is disposed on a part of the semiconductor device layer and covers the current blocking layer. The first electrode is disposed on the current spread layer, wherein a part of the current blocking segment is overlapped with the first electrode. A contour of the current blocking segment and a contour of the first electrode are similar figures, and the contour of the first electrode is within the contour of the current blocking segment. The current distribution adjusting segment is not overlapped with the first electrode. Moreover, the second electrode is disposed on the semiconductor device layer.

In an embodiment of the present invention, the semiconductor device layer includes a first type semiconductor layer, a light-emitting layer and a second type semiconductor layer, wherein the light-emitting layer is located on a part of the first type semiconductor layer, and the second type semiconductor layer is located on the light-emitting layer.

In an embodiment of the present invention, the current block layer is disposed on a part of the second type semiconductor layer.

In an embodiment of the present invention, the current spread layer is disposed on the current blocking layer and a part of the second type semiconductor layer.

In an embodiment of the present invention, the current blocking segment and the current distribution adjusting segment are connected.

In an embodiment of the present invention, the current distribution adjusting segment is extended from an edge of the current blocking segment towards an edge of the semiconductor device layer.

In an embodiment of the present invention, the current distribution adjusting segment has a plurality of openings or notches, and the current spread layer is electrically connected to the semiconductor device layer through the openings or the notches.

In an embodiment of the present invention, the openings or the notches of the current distribution adjusting segment are bar-shape slits.

In an embodiment of the present invention, the current blocking segment and the current distribution adjusting segment are separated.

In an embodiment of the present invention, the current distribution adjusting segment is distributed at two sides of the second electrode.

In an embodiment of the present invention, a material of the current blocking layer includes a-SiC based material.

In an embodiment of the present invention, the SiC based material includes $SiO_xC_y$:H, SiC, $SiC_xN_y$ or $SiO_xC_yN_z$.

In an embodiment of the present invention, a material of the current blocking layer includes silicon oxide, silicon nitride or silicon oxy-nitride.

As described above, the LED chip of the present invention has the current blocking layer, and the current blocking layer includes the current blocking segment and the current distribution adjusting segment. Therefore, a current distribution in the LED chip can be adjusted according to a distribution or pattern of the current distribution adjusting segment.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
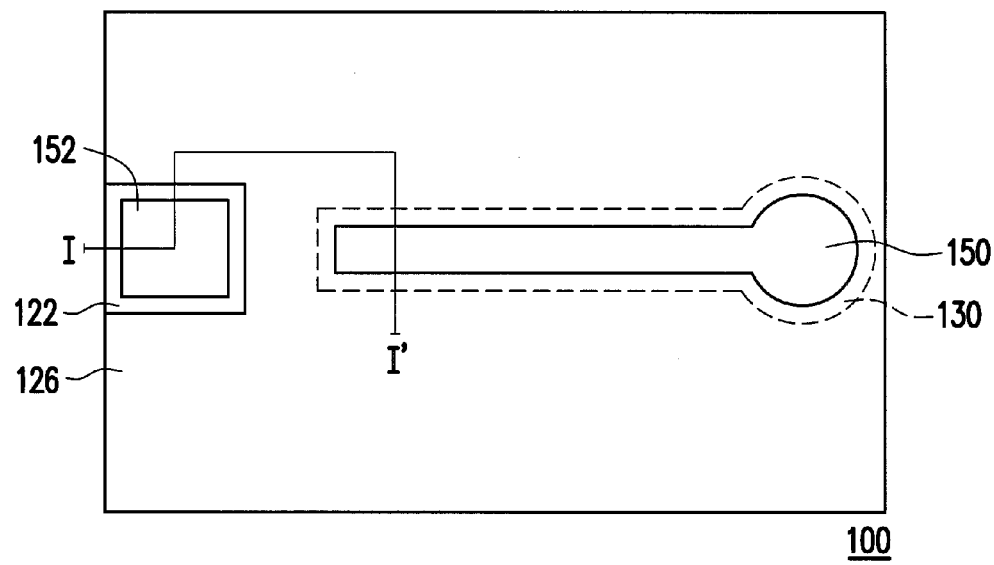
FIG. 1A is top view of a conventional LED chip having a current blocking layer.
Figure 1B:
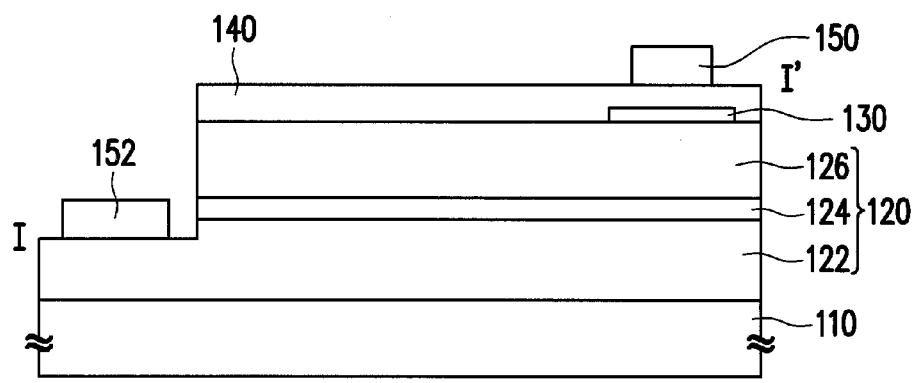
FIG. 1B is a cross-sectional view of a LED chip of FIG. 1A along a I-I' line.
Figure 2:
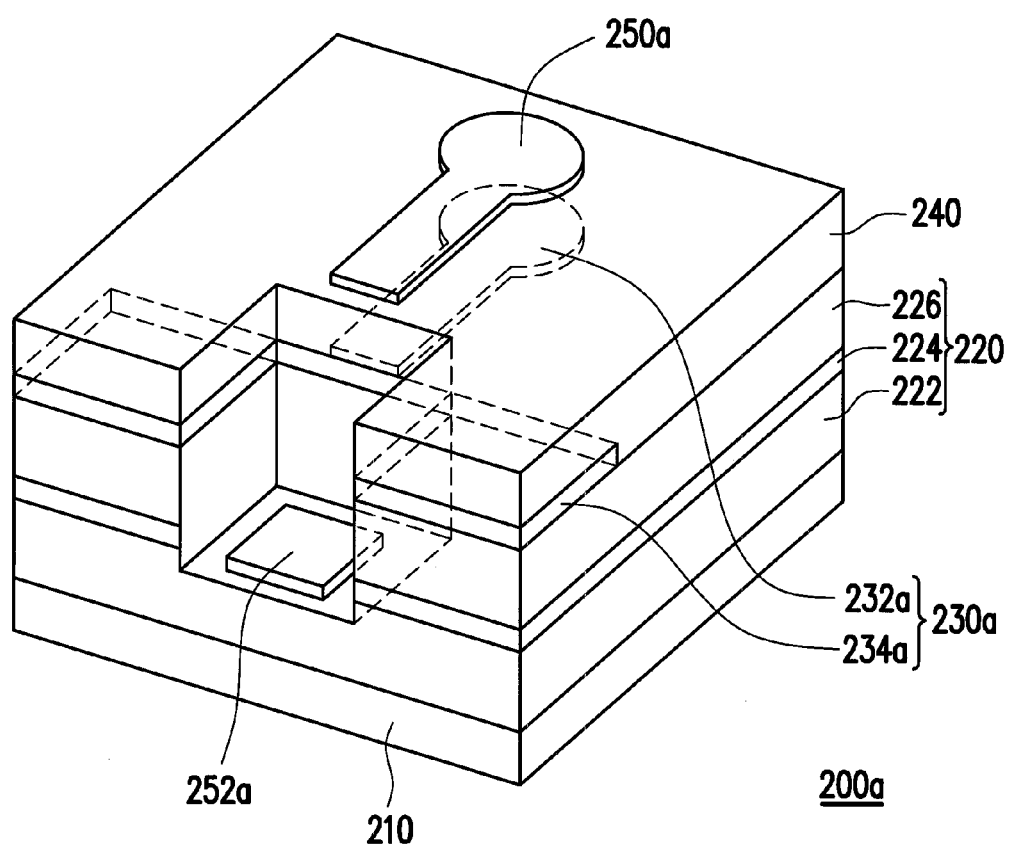
FIG. 2 is a three-dimensional view of a LED chip according to an embodiment of the present invention.

FIG. 2 is a three-dimensional view of a LED chip according to an embodiment of the present invention. Referring to FIG. 2, the LED chip 200a of the present embodiment includes a substrate 210, a semiconductor device layer 220, a current blocking layer 230a, a current spread layer 240, a first electrode 250a and a second electrode 252a. The semiconductor device layer 220 is disposed on the substrate 210. The current blocking layer 230a is disposed on a part of the semiconductor device layer 220, wherein the current blocking layer 230a includes a current blocking segment 232a and a current distribution adjusting segment 234a. Moreover, the current spread layer 240 is disposed on a part of the semiconductor device layer 220 and covers the current blocking layer 230a. The first electrode 250a is disposed on the current spread layer 240, wherein a part of the current blocking segment 232a is overlapped with the first electrode 250a. A contour of the current blocking segment 232a and a contour of the first electrode 250a are similar figures, and the contour of the first electrode 250a is within the contour of the current blocking segment 232a. The current distribution adjusting segment 234a is not overlapped with the first electrode 250a. Moreover, the second electrode 252a is disposed on the semiconductor device layer 220.

In present embodiment, the semiconductor device layer 220 includes a first type semiconductor layer 222, a light-emitting layer 224 and a second type semiconductor layer 226, wherein the light-emitting layer 224 is located on a part of the first type semiconductor layer 222, and the second type semiconductor layer 226 is located on the light-emitting layer 224.

As shown in FIG. 2, the first electrode 250a and the second electrode 252a are not located on a same plane, wherein the first electrode 250a is located on the second type semiconductor layer 226, and the second electrode 252a is located on the first type semiconductor layer 222. Namely, a position of the second electrode 252a is substantially lower than that of the first electrode 250a.

As shown in FIG. 2, the current blocking layer 230a of the present embodiment is disposed on a part of the second type semiconductor layer 226. The current spread layer 240 is disposed on the current blocking layer 230a and a part of the second type semiconductor layer 226. It should be noted that the current blocking segment 232a and the current distribution adjusting segment 234a are physically separated. Particularly, the current distribution adjusting segment 234a is distributed at two sides of the second electrode 252a. However, in other embodiments, the current blocking segment 232a and the current distribution adjusting segment 234a can be connected to each other.

A material of the current blocking layer 230a includes a SiC-based material. In detail, in an exemplary embodiment, the SiC based material includes $SiO_xC_y$:H, SiC, $SiC_xN_y$, or $SiO_xC_yN_z$. In other embodiments, the material of the current blocking layer 230a includes silicon oxide, silicon nitride or silicon oxy-nitride.

In the present embodiment, the current blocking layer 230a is disposed under the first electrode 250a, and the current distribution adjusting segment 234a of the current blocking layer 230a is further disposed on the second type semiconductor layer 226 and is located at two sides of the second electrode 252a. In this way, the current cannot pass through a region where the current blocking layer 230a is allocated. Therefore, current density of the central area in the LED chip 200a where the current blocking layer 230a is not allocated is increased. In other words, under a same driving current, a light-emitting brightness of the central area in the LED chip 200a where the current blocking layer 230a is not allocated can be increased.

In the aforementioned embodiment, by applying the current blocking segment 232a and the current distribution adjusting segment 234a of the current blocking layer 230a, the current of the LED chip 200a can be adjusted to a predetermined area. In the following embodiment, other types of current blocking layer are described in detail with reference of other figures.

Figure 3:
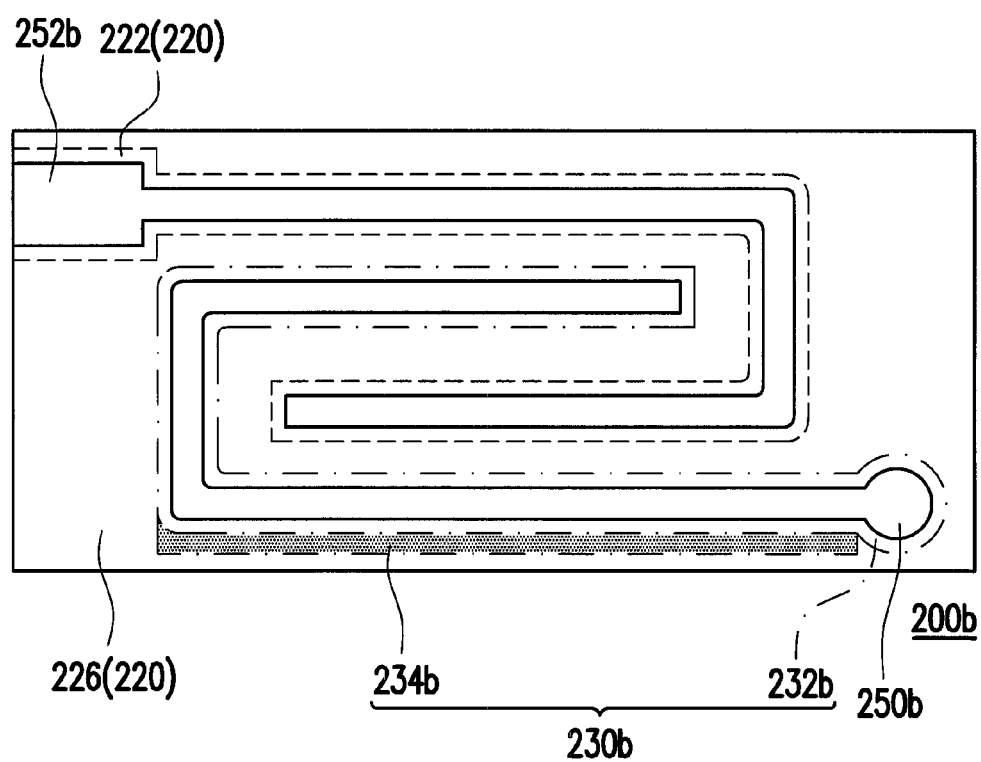
FIG. 3 is a top view of a LED according to another embodiment of the present invention.

FIG. 3 is a top view of a LED according to another embodiment of the present invention. Referring to FIG. 3, a structure of the LED chip 200b of the present embodiment is similar to that of the LED 200a except that shapes and distribution positions of a first electrode 250b, a second electrode 252b and a current blocking layer 230b are different.

As shown in FIG. 3, the first electrode 250b and the second electrode 252b all have a U-shape, and are disposed in interlace. It should be noted that the first electrode 250b and the second electrode 252b are not located on the same plane, wherein the first electrode 250b is located on the second type semiconductor layer 226, and the second electrode 252b is located on the first type semiconductor layer 222. Namely, a position of the second electrode 252b is substantially lower than that of the first electrode 250b.

In the present embodiment, the current distribution adjusting segment 234b is extended from an edge of the current blocking segment 232b towards an edge of the semiconductor device layer 220. Therefore, the current cannot pass through a region near the edge of the semiconductor device layer 220. In other words, the current can be controlled to just flow through a region on the LED chip 200b where the current blocking layer 230b is not distributed.

Figure 4A:
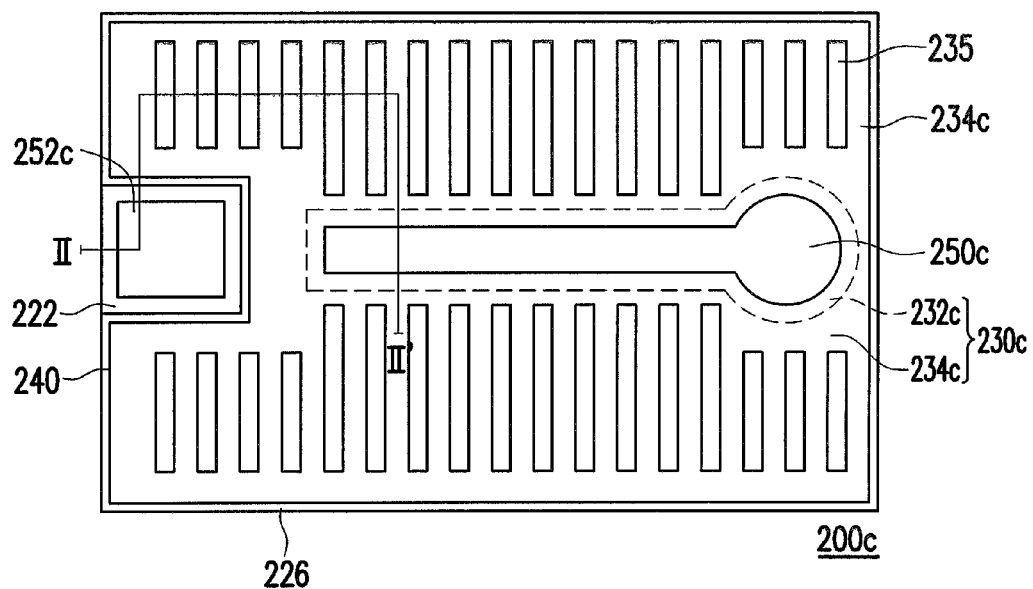
FIG. 4A is a top view of a LED chip according to still another embodiment of the present invention.
Figure 4B:
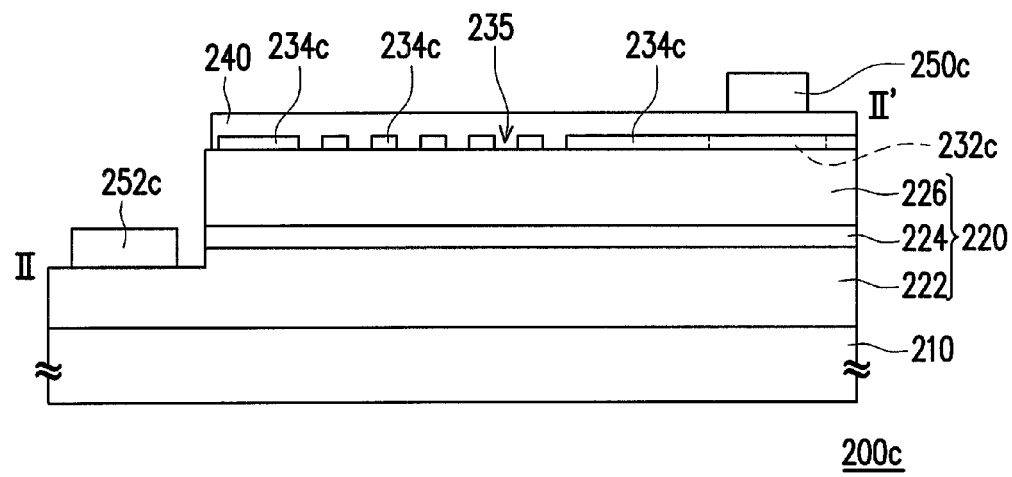
FIG. 4B is a cross-sectional view of a LED chip of FIG. 4A along a II-II' line.

FIG. 4A is a top view of a LED chip according to still another embodiment of the present invention. FIG. 4B is a cross-sectional view of the LED chip of FIG. 4A along a II-II' line. Referring to FIG. 4A and FIG. 4B, a structure of the LED chip 200c of the present embodiment is similar to that of the LED chip 200a in FIG. 2 wherein, including but not limited, the first electrode 250c and the second electrode 252c of the LED chip 200c are corresponding to the first electrode 250a and the second electrode 252a of the LED chip 200a respectively, except that the current distribution adjusting segment 234c of the current blocking layer 230c in the present embodiment has a plurality of openings 235, and the current spread layer 240 is electrically connected to the semiconductor device layer 220 through the openings 235. It should be noted that the current blocking segment 232c and the current distribution adjusting segment 234c of the current blocking layer 230c of the present embodiment are connected.

In the present embodiment, the openings 235 are bar-shape slits, and in other embodiments, the openings 235 can be extended to the edge of the semiconductor device layer 220 such that a plurality of notches can be formed.

In summary, the LED chip of the present invention has the current blocking layer, and the current blocking layer includes the current blocking segment disposed under the first electrode and the current distribution adjusting segment, so that the current cannot pass through the current blocking segment and the current distribution adjusting segment, and is transferred to the other regions of the LED chip. Moreover, the position of the current distribution adjusting segment layer can be adjusted according to actual requirements, so as to improve the overall light-emitting efficiency of the LED chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light-emitting diode (LED) chip, comprising:
a substrate;
a semiconductor device layer disposed on the substrate;
a current blocking layer disposed on the semiconductor device layer and having a plurality of openings or notches;
a current spread layer covering the current blocking layer and electrically connected to the semiconductor device layer through the plurality of openings or notches;
a first electrode disposed on the current spread layer, wherein the first electrode does not overlap with the plurality of openings or notches; and
a second electrode disposed on the semiconductor device layer,
wherein the current blocking layer, the current spread layer, the first electrode and the second electrode are located on one side of the semiconductor device layer opposite to the substrate,
wherein the first electrode extends along a direction toward the second electrode, and a first group and a second group of the openings or notches are distributed at two sides of the first electrode, and
wherein the plurality of openings or notches comprise bar-shape slits not parallel with the first electrode.

2. The LED chip as claimed in claim 1, wherein the first group and the second group of the openings or notches are distributed symmetrically at the two sides of the first electrode.

3. The LED chip as claimed in claim 1, wherein the semiconductor device layer comprises:
a first type semiconductor layer;
a light-emitting layer; and
a second type semiconductor layer, wherein the light-emitting layer is located on a part of the first type semiconductor layer, and the second type semiconductor layer is located on the light-emitting layer.

4. The LED chip as claimed in claim 3, wherein the current block layer is disposed on a part of the second type semiconductor layer.

5. The LED chip as claimed in claim 3, wherein the current spread layer is disposed on the current blocking layer and a part of the second type semiconductor layer.

6. The LED chip as claimed in claim 1, wherein the current blocking layer extends to an edge of the semiconductor device layer.

7. The LED chip as claimed in claim 1, wherein the current blocking layer extends to two sides of the second electrode.

8. The LED chip as claimed in claim 1, wherein a material of the current blocking layer comprises a SiC-based material.

9. The LED chip as claimed in claim 8, wherein the SiC-based material comprises SiOxCy:H, SiC, SiCxNy or SiOxCyNz.

10. The LED chip as claimed in claim 1, wherein a material of the current blocking layer comprises silicon oxide, silicon nitride or silicon oxy-nitride.

11. A light-emitting diode (LED) chip, comprising:
a substrate;
a semiconductor device layer disposed on the substrate;
a current blocking layer disposed on one side of the semiconductor device layer opposite to the substrate and comprising a current blocking segment and a current distribution adjusting segment;
a current spread layer disposed on one side of the semiconductor device layer opposite to the substrate and covering the current blocking layer;
a first electrode disposed on one side of the current spread layer opposite to the substrate and comprising a first portion and a second portion; and
a second electrode disposed on one side of the semiconductor device layer opposite to the substrate and comprising a first portion and a second portion located at two sides of the second portion of the first electrode, and the second portion of the second electrode is located between the first portion and the second portion of the first electrode;
wherein the first electrode has a contour within the contour of the current blocking segment and does not overlap with the current distribution adjusting segment, and the current distribution adjusting segment extends from the current blocking segment toward an edge of the semiconductor device layer away from the second electrode.

12. The LED chip as claimed in claim 11, wherein the current distribution adjusting segment is formed in a bar shape along the first portion of the first electrode.

13. The LED chip as claimed in claim 11, wherein the semiconductor device layer comprises:
a first type semiconductor layer;
a light-emitting layer; and a second type semiconductor layer, wherein the light-emitting layer is located on a part of the first type semiconductor layer, and the second type semiconductor layer is located on the light-emitting layer.

14. The LED chip as claimed in claim 13, wherein the current block layer is disposed on a part of the second type semiconductor layer.

15. The LED chip as claimed in claim 13, wherein the current spread layer is disposed on the current blocking layer and a part of the second type semiconductor layer.

16. The LED chip as claimed in claim 11, wherein a material of the current blocking layer comprises a SiC-based material.

17. The LED chip as claimed in claim 16, wherein the SiC-based material comprises SiOxCy:H, SiC, SiCxNy or SiOxCyNz.

18. The LED chip as claimed in claim 11, wherein a material of the current blocking layer comprises silicon oxide, silicon nitride or silicon oxy-nitride.

* * * * *